United States Patent
Benjamin et al.

(10) Patent No.: US 7,254,510 B2
(45) Date of Patent: Aug. 7, 2007

(54) SMART COMPONENT-BASED MANAGEMENT TECHNIQUES IN A SUBSTRATE PROCESSING SYSTEM

(75) Inventors: Neil Benjamin, Austin, TX (US); Richard Alan Gottscho, Pleasanton, CA (US); Nicolas Bright, San Jose, CA (US); Robert Steger, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/498,544

(22) Filed: Aug. 2, 2006

(65) Prior Publication Data

US 2006/0271325 A1 Nov. 30, 2006

Related U.S. Application Data

(62) Division of application No. 10/927,161, filed on Aug. 25, 2004, now Pat. No. 7,152,011.

(51) Int. Cl.
*G06F 19/00* (2006.01)
(52) U.S. Cl. .................................. 702/117; 438/14
(58) Field of Classification Search ............... 702/117, 702/118, 182–185, 188; 438/14, 6
See application file for complete search history.

(56) References Cited

U.S. PATENT DOCUMENTS

| | | | | |
|---|---|---|---|---|
| 5,629,870 A | * | 5/1997 | Farag et al. | ............ 700/286 |
| 2005/0159911 A1 | * | 7/2005 | Funk et al. | ............ 702/104 |

* cited by examiner

*Primary Examiner*—Edward Raymond
(74) *Attorney, Agent, or Firm*—IP Strategy Group, P.C.

(57) ABSTRACT

A method of component management in a substrate processing system is disclosed. The substrate processing system has a set of components, at least a plurality of components of the set of components being designated to be smart components, each component of the plurality of components having an intelligent component enhancement (ICE). The method includes querying the plurality of components to request their respective unique identification data from their respective ICEs. The method further includes receiving unique identification data from the plurality of components if any of the plurality of components responds to the querying. The method additionally includes flagging the first component for corrective action if a first component of the plurality of components fails to provide first component unique identification data when the first component identification data is expected.

17 Claims, 5 Drawing Sheets

SMART COMPONENT-BASED MANAGEMENT TECHNIQUES IN A SUBSTRATE PROCESSING SYSTEM

This is a Divisional application of prior application Ser. No. 10/927,161 filed on Aug. 25, 2004 now U.S. Pat. No. 7,152,011, the disclosure of which is incorporated herein by reference.

BACKGROUND OF THE INVENTION

The present invention relates in general to smart components in substrate processing systems and the use of smart components and smart component-based management techniques for improving the installation, operation, and maintenance of substrate processing systems.

Substrate processing systems, such as plasma processing systems, wet chemical processing systems, chemical-mechanical polish (CMP) systems, and the like, have long been employed in the processing of substrates (e.g., semiconductor wafers, flat display panels, optics substrates, nanomachine substrates, and the like). As technology progresses, substrate processing systems (such as plasma processing systems) have become more costly to acquire and maintain. Part of the cost increase can be attributed to the increased complexity of the substrate processing systems themselves. This is because as devices shrink and production pressure increases in an attempt to keep up with the ever-increasing consumer demand for constantly improving electronic products, customers expect that the substrate processing systems be capable of carrying out highly demanding etch and deposition processes, as well as be capable of high throughput rates. As a result, modem substrate processing systems are increasingly characterized by highly sophisticated designs, exotic materials, and precisely tooled parts.

When a part needs to be installed, as a replacement part in accordance with a predefined maintenance schedule, for example, manufacturers of substrate processing systems often insist that the replacement part be certified. The certification process insures that the part meets stringent engineering specifications, for example with respect to the composition of the part material and the dimensions of the part.

When a certified part is employed, the manufacturer of the substrate processing system can be reasonably certain that the substrate processing system has the intended configuration and conforms with expected system specifications to run the required application (e.g., the etch or deposition process). The use of certified parts benefits both the owner of the substrate processing systems, who enjoys a reliable system that yields expected process results, and the manufacturer, who enjoys not having to repair substrate processing systems that are broken due to inferior parts.

As in the case with most quality products, the certified parts tend to cost more than their inferior copies. For unscrupulous grey-market operators, the temptation to produce inferior copies of substrate processing system parts and to pass them off as "acceptable substitutes" is high since a substantial profit can be gained by making parts cheaply and selling them into a high-dollar parts market. For owners of the substrate processing systems, the temptation to purchase and use non-certified parts is high, since certified parts, being manufactured with great precision, tend to cost more in the short term. In these cases, both the owners and the manufacturers suffer.

The owner, despite saving some money in the short term, invariably suffers from unreliable system performance and a frequently interrupted production schedule due to equipment failures. The manufacturer suffers from having to support and repair a greater number of broken systems, and possibly from being unjustly branded as a producer of unreliable substrate processing equipment.

There are other issues with respect to the installation, operation and maintenance of parts. In today's substrate processing systems, it is all too easy to incorrectly install a part, to install the wrong part for a given system and/or application, and/or to miss a required maintenance task on a part. As substrate processing systems become more complex, the problems are exacerbated.

In view of the foregoing, a different approach to managing substrate processing system components is required.

SUMMARY OF THE INVENTION

The invention relates, in one embodiment, to a method of component management in a substrate processing system. The substrate processing system has a set of components, at least a plurality of components of the set of components being designated to be smart components, each component of the plurality of components having an intelligent component enhancement (ICE). The method includes querying the plurality of components to request their respective unique identification data from their respective ICEs. The method further includes receiving unique identification data from the plurality of components if any of the plurality of components responds to the querying. The method additionally includes flagging the first component for corrective action if a first component of the plurality of components fails to provide first component unique identification data when the first component identification data is expected.

In another embodiment, the invention relates to a method of component management in a substrate processing system. The substrate processing system has a set of components, at least a plurality of components of the set of components being designated to be smart components, each component of the plurality of components having an intelligent component enhancement (ICE). The method includes querying, via a transducer, a first component of the plurality of components to receive first characterizing data from an ICE associated with the smart component. The method also includes receiving, via the transducer, the first characterizing data. The method additionally includes comparing the characterizing data with acceptable specification data for the smart component. If the first characterizing data fails to meet acceptable specification data for the smart component, the method includes electronically flagging the first component for corrective action.

In yet another embodiment, the invention relates to a method of component management in a substrate processing system. The substrate processing system has a set of components, at least a plurality of components of the set of components being designated to be smart components, each component of the plurality of components having an intelligent component enhancement (ICE). The method includes querying, via a transducer, a first component of the plurality of components to obtain first calibration data. The first calibration data is obtained using one of a first technique and a second technique. The first technique involves obtaining the first calibration data from an ICE associated with the first component. The second technique involves obtaining unique identifying data from the ICE and employing the unique identifying data to obtain the first calibration data from a data store external to the first component. The method additionally includes employing the first calibration data in one of installing the substrate processing system and maintaining the substrate processing system.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
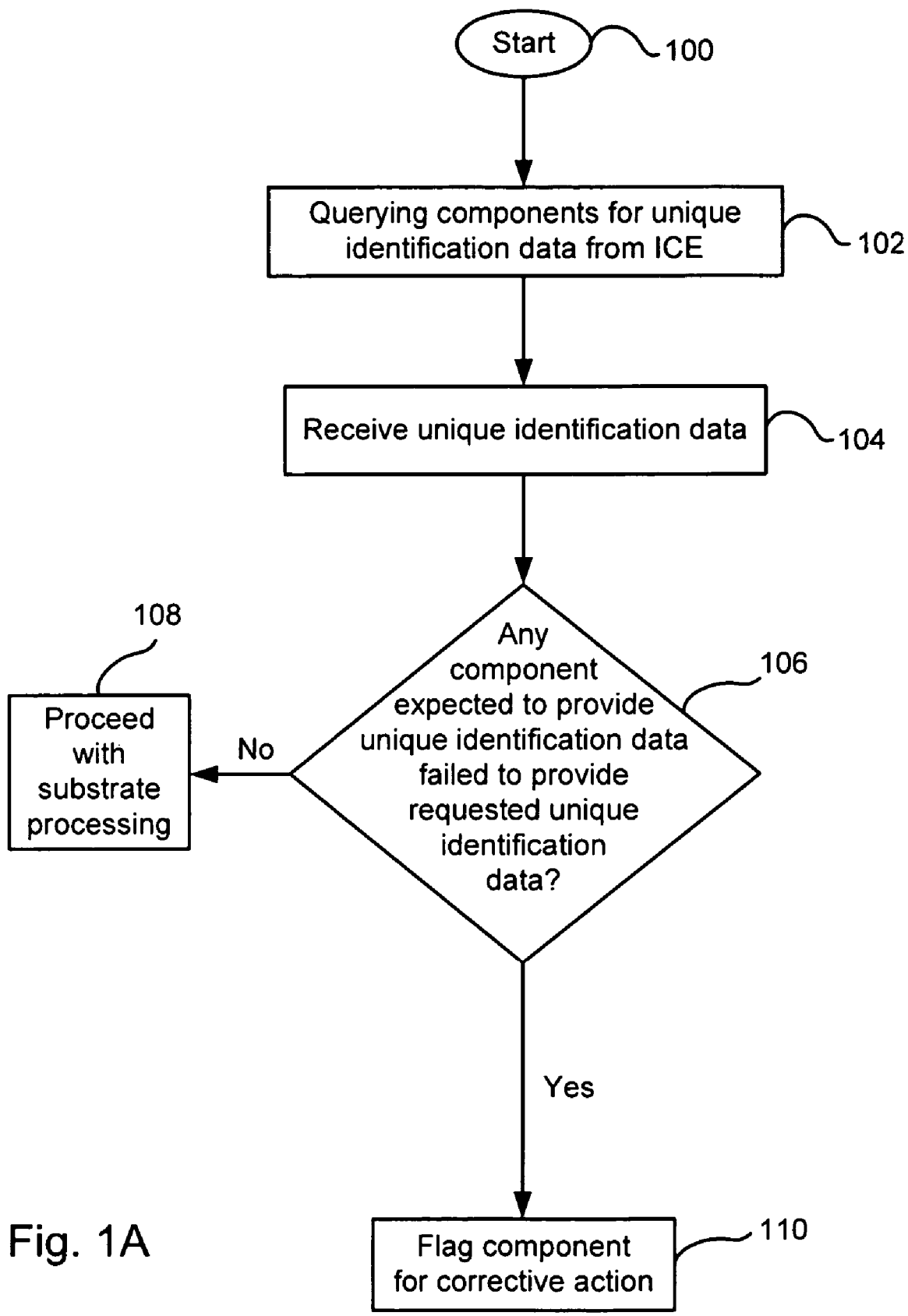
FIG. 1A illustrates, in accordance with an embodiment of the present invention, a method for managing components utilizing data from smart components.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention relates, in one embodiment, to smart components configured for use in a substrate processing environment and techniques for leveraging the smart components to improve individual components, subsystems and system management. To elaborate, a smart component incorporates at minimum an Intelligent Component Enhancement (ICE) that at least uniquely identifies the component. As the term is employed herein, a smart component may represent an indivisible elemental part (such as a single solid piece of cast aluminum alloy) or a subsystem (such as an RF power supply).

A smart component may be based on any component that is a part of the substrate processing system, whether or not such component is in direct contact with the reactive gas, liquid or plasma. For example, a component of a plasma processing system may include the gas injector, the gas injection system, the plasma chamber, the dielectric window for plasma coupling, the liner, the focus ring or other edge ring or uniformity ring(s), the chuck assembly, the chuck itself, chuck supporting component(s), the endpoint detection system and/or other diagnostic system(s), the RF power supply, or the match network, etc. It is not necessary that all components in a substrate processing be smart components. A mix of smart components and conventional components (i.e., those without the ICE) can co-exist on a given system.

Generally speaking, each smart component can be uniquely identified by its ICE. Preferably, the ICE contains data that can be machine readable although the invention does not exclude the combination of human-readable ICE and techniques for utilizing such human-readable ICE in combination with external data in order to improve the installation, operation, and maintenance of substrate processing systems. Examples of human-readable ICEs include alphanumerics or other visually-perceptible symbols etched, attached, painted, or engraved into the smart components.

If the ICE is machine-readable, the data pertaining the smart component may be manually or automatically read. For example, if the ICE is a bar code, manual reading may include using a hand-held bar code reader to read the bar code. The same bar code may of course be automatically read if the scanning of the bar code can be accomplished without human intervention. Although bar codes are employed as an example, any visually, electronically, electromagnetically, optically, chemically, or audibly perceptible mechanism may be employed by the ICE. Such examples include shapes or patterns to be recognized, various forms of tagging or painting with isotopes or chemicals to be detected chemically or via electromagnetic detection arrangements. Automatic reading may employ technologies such as RFID, which allows the smart component to be identified without requiring contact or line-of-sight reading and/or writing.

RFID is in fact one of the preferred ICE enabling technologies. Generally capable of transmitting data without direct physical contact or line of sight in the electromagnetic spectrum, RFID operates similar to bar code but with far greater capability. An example RFID system may require the following components: transponder (or tag), reader/writer (interrogator), antenna, and host computer.

The transponder is part of the system and includes a small electronic circuit preferably with an attached silicon chip. RFID tags may be powered and may be classified as active or passive. Some active tags have an internal battery that allows for long-read ranges. They are typically read/write capable and may often be seen in toll collection applications for example. Passive tags do not have a battery and are powered by a separate external source typically the interrogator.

A typical reader generally contains an antenna to transmit information to the tag as well as receive it from the tag. The size and form of the antenna may be dependent on the specific application as well as frequency chosen. It typically houses a decoder and RF module as well as the antenna. Readers can be fixed, i.e. mounted, or portable such as a handheld depending on the application.

Furthermore, where appropriate the ICE is configured to be resistant to the corrosive and/or destructive effects of the environment to which the smart component is subjected. Thus an ICE in a plasma environment would be constructed such that it is substantially resistant to plasma etching or deposition, as well as resistant to being damaged by the RF energy associated with plasma generation and/or the high temperature environment if such exposure is required of the smart component. Likewise, an ICE in a chemical etch environment for example would be substantially resistant to the chemical employed in the etching process. Preferably, the ICE along with any supporting or shielding structure is configured to minimize impact on the substrate processing process (e.g., by minimizing contamination and/or impact to process parameters)

To render an ICE more resistant to damage, the ICE or a portion thereof may be embedded within the smart component so that the ICE or the vulnerable portion thereof is not physically exposed. For data transfer, such component-embedded ICE may rely on non line-of-sight techniques. Alternatively, the ICE or part thereof may be shielded by an appropriate shield (formed from a suitable material such as metal, dielectric, ceramic, plastic, etc.). The shield or portions thereof may be optically transparent, permitting the use of line-of-sight data transfer techniques that requires some degree of optical transparency. Even when the shield is not optically transparent, if the shield is designed with an appropriate skin depth, or a dielectric boundary is provided the shield can transmit sufficient electromagnetic signal such as to allow RFIDs or other non-contact, non line-of-sight techniques still to be employed for data transmission. The human operator can also remove the shield for data transfer but it is preferable that the ICE is configured for automatic data transfer without human intervention.

So far, ICEs are discussed as static devices whose data are unchangeable. However, embodiments of the invention also include programmable ICEs, which allow data to be written into the ICEs. To an extent, all ICEs need to be written once (e.g., at the factory) at which time the unique identification data is initially assigned to the component. If the data in these ICEs cannot be changed in the field, these ICEs are referred to herein as static ICEs.

Programmable ICEs differ from static ICEs in that data can be written into programmable ICEs in the field. Generally speaking, the programmable ICEs include on-board memory to store additional data. The amount of memory may be as little as a few bytes to store only the unique identifying data, or may be sufficiently extensive to, for example, log data collected during process runs. The memory may be semiconductor-based, or may be optical or opto-electromagnetic based, for example.

As mentioned, the data may be written once (e.g., at the factory) and unchangeable. The data may alternatively or additionally be unalterably written such that old data cannot be erased. Such unalterably written data facilitates auditing. The data in the ICEs may additionally or alternatively be written and rewritten over and over. In some cases, it may be appropriate to include more than one type of memory or chip or circuit in the ICE. Further, it is preferable in some cases that strong security arrangements (such as encryption and/or password) exist in the ICEs to protect the data from tampering and/or unauthorized access. This aspect will be apparent when the data is leveraged using techniques discussed later herein for components and/or system management.

The data in the ICEs may be written by external devices, i.e., devices other than the smart component associated with the ICE. For example, a host computer or the substrate processing system controller may write to the ICEs of the various parts. Alternatively or additionally, an ICE may include probes to obtain data for writing into its own ICE. For example, a chuck may include a temperature probe to write temperate data into its ICE. As another example, a match network may include a current probe to record the amount of current flowed into the substrate processing system. During a substrate processing cycle, data may be logged into the ICE of a smart component, in one embodiment, or may be provided by the ICE to another device (e.g., another smart component, the host computer, or the substrate processing system controller), in another embodiment.

Data storage in the ICE, as well as data transfers to and from the ICE, is preferably accomplished with a high degree of security. Digital signature, DES, and other security techniques may be employed to achieve data security.

ICEs that are exposed to the plasma environment and yet need to transfer data during plasma processing may be designed such that their read/write RF frequencies are outside of the frequency range of the RF signal employed for substrate processing. For example, many substrate processing systems employ 2 MHz, 13.56 MHz, or 27 MHz RF signal for etching applications. By avoiding such frequency ranges, data transfer may be accomplished more reliably and/or efficiently. Alternatively, the ICE may employ any frequency for data communication but may need to wait until plasma processing is completed before transmitting its data to the recipient device, providing only that the data communication circuitry survives any RF or other power applied during the actual process execution.

In an embodiment, the unique identification data of the ICE is employed to facilitate accessing external data stores (which may be disposed with the substrate processing system or may be accessible via a network such as a Local Area Network, a Wide-Area Network or the Internet). The use of such counterpart external data stores vastly improves the usefulness of such unique identifying data, especially if the ICEs cannot store a large amount of information. The unique identifying data may be employed, in one embodiment, as an index to determine the electrical, mechanical, and/or material composition data pertaining to the smart component. The history of the smart component (including for example its manufacturing data, its deployment data, its usage data, and the like), its calibration data, its specification, etc., may also be obtained by searching such external data stores using the unique identifying data as an index.

The database may be maintained by, for example, the manufacturer of the substrate processing system or by a distributor or another organization and accessible via a data network. Generally speaking, the external data store is preferably stored in a manner so as to protect the confidential information of individual owners or operators of substrate processing systems. Available data security techniques may be employed to protect the confidentiality.

Figure 1B:
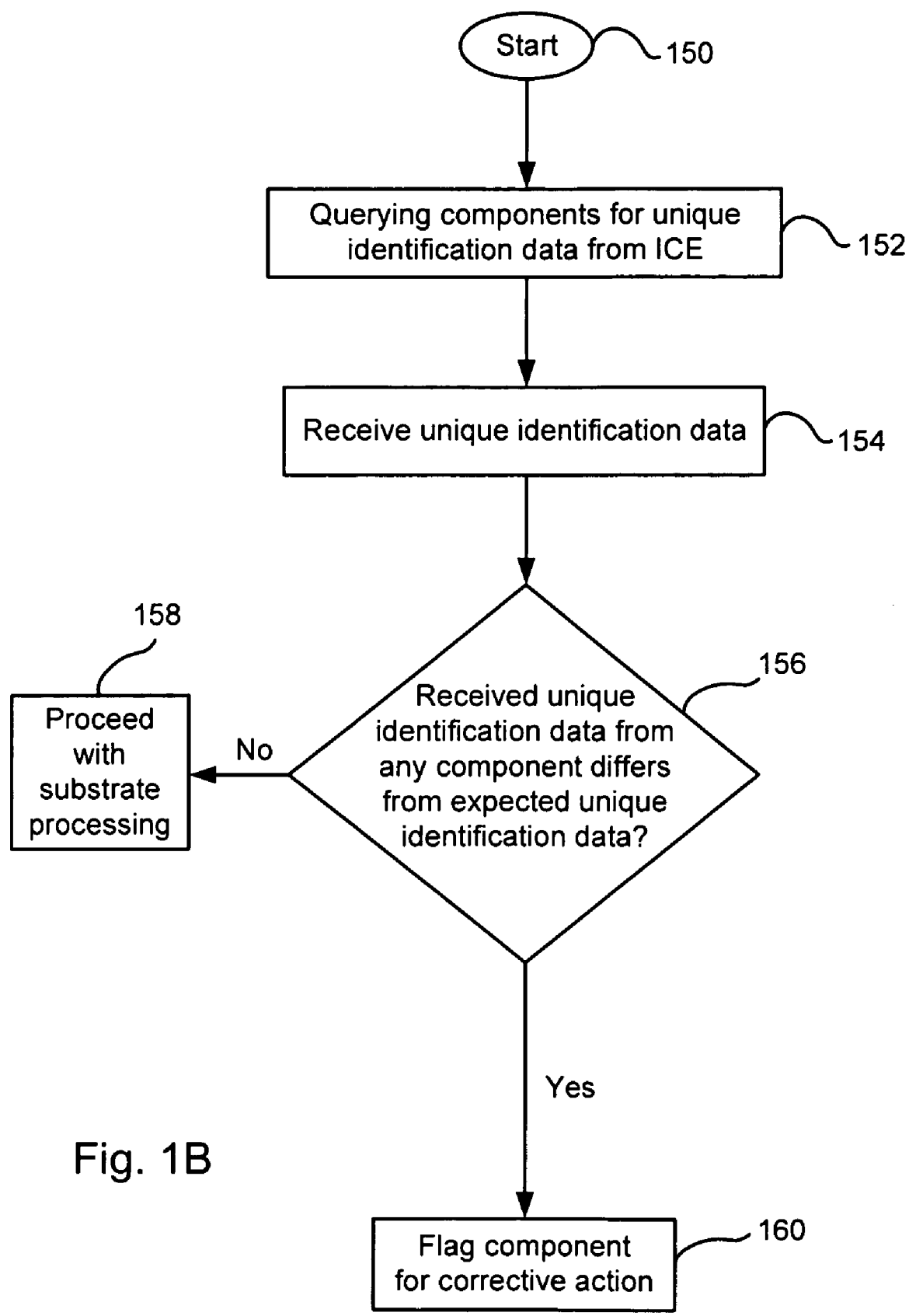
FIG. 1B illustrates, in accordance with another embodiment of the present invention, a method for managing components utilizing data from smart components.

As an example of a smart component-based management technique, the ICE data can be employed to ascertain in real time or near real time whether a component is a certified component. This aspect of the invention is illustrated by FIGS. 1A and 1B. By querying (e.g., at installation time, at system startup time, or any other random time) the smart component for its unique identification data, the substrate processing system or a host computer may be able to determine whether the component is designed for a particular proposed application (e.g., a particular etch or deposition process). The substrate processing system or host computer may be endowed with a database containing data pertaining to the proposed application and the components that would be suitable, or such database may be accessible via a computer network. The substrate processing system or host computer may also be able to determine, simply by querying the smart component (e.g., FIG. 1A: 102–104, FIG. 1B: 152–154), whether the smart component is certified in the sense that it is manufactured in accordance with the manufacturer's specification or under proper authorization. If a component is found not to be properly certified (based on the received unique identification data, that component may be electronically flagged (e.g., flagged in a database) for corrective action (e.g., FIG. 1A: 110, FIG. 1B: 160).

As another example of a smart component-based management technique, the correlation between the queried unique identification data and the external data store may be utilized to prevent or take corrective actions in situations wherein an out-of-date component or, for example, a wornout component that should have been discarded is impermissibly installed and used. Of course if the component is a counterfeit component or a non-certified component, its identification data, or the lack thereof, (e.g., FIG. 1A: 106, FIG. 1B: 156) would reveal such a counterfeit attempt or an attempt to use a non-certified component. Even if the unique identification data is replicated, a central database may be able to detect that the same unique identification data is being detected in two different substrate processing system and/or in two geographically separate locations and to generate an appropriate alert.

If the received unique identification data is as expected, further system installation and/or power-up and/or substrate processing may be allowed to proceed (e.g., FIG. 1: 108, FIG. 1B: 158).

Figure 2:
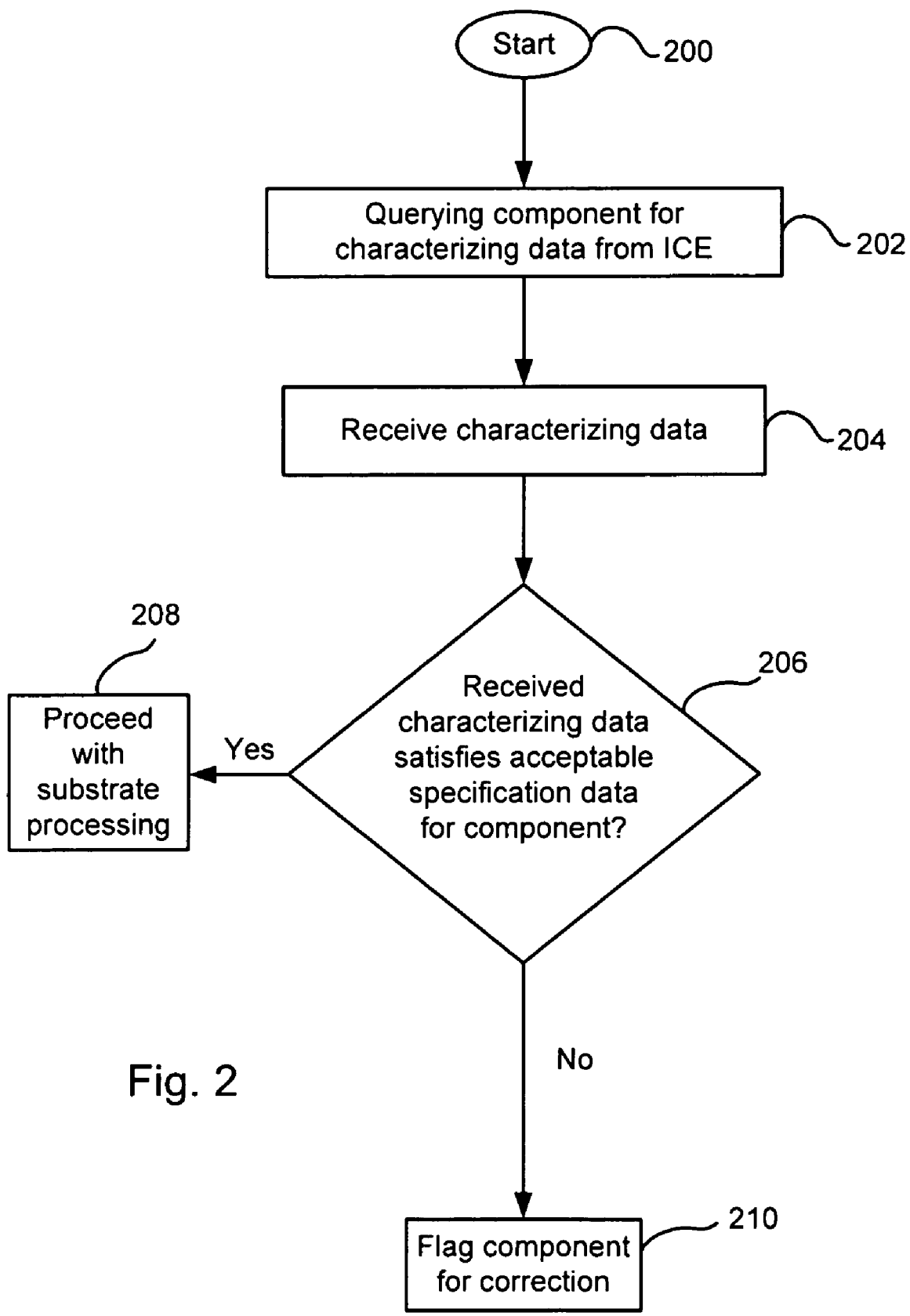
FIG. 2 illustrates, in accordance with another embodiment of the present invention, a method for managing components utilizing data from smart components.

As another example, the ICE may include component characterizing data (which includes historical data describing one or more of the component usage pattern up to date, the calibration data, the data pertaining to applications that employed the smart component, and/or the like). The component characterizing data may then be queried (e.g., FIG. 2, 202–204) and compared against some acceptable specification data (e.g., FIG. 2: 206). If the comparison reveals that the smart component is no longer within specification for use (e.g., too old, too worn out, having been through too many processing cycles, out-of-date, etc.), the smart component may be electronically flagged (e.g., flagged in a database) for corrective action (e.g., FIG. 2: 210). Note that the acceptable specification data for the smart component and the logic for the comparison may reside with the smart component itself, which allows the smart component to essentially self-diagnose. Alternatively or additionally, the acceptable specification data may reside in an external database. If the received component characterizing data is satisfactory, further system installation and/or power-up and/or substrate processing may be allowed to proceed (e.g., FIG. 2: 208).

Figure 3:
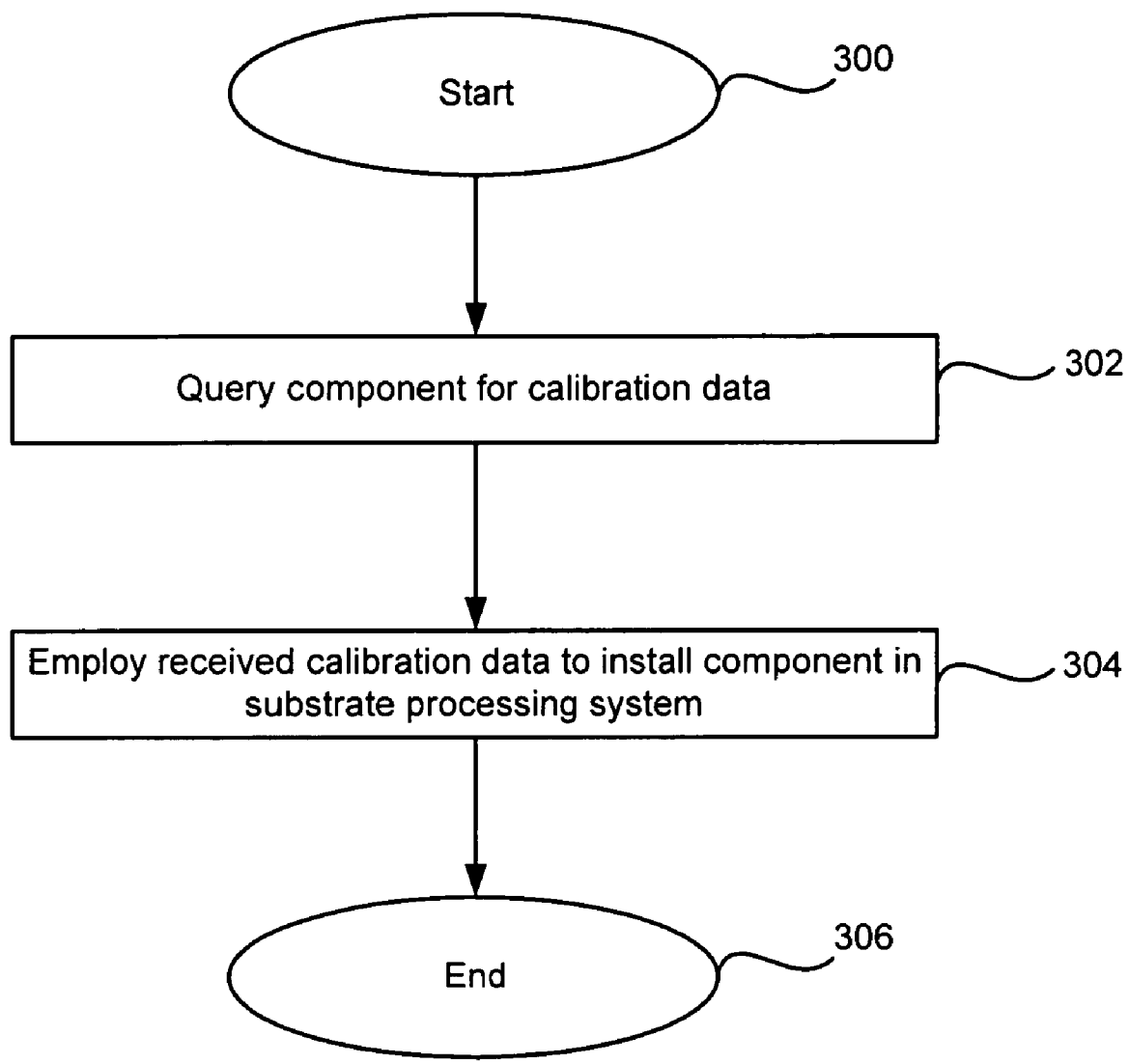
FIG. 3 illustrates, in accordance with another embodiment of the present invention, a method for managing components utilizing data from smart components.

As mentioned, calibration data (i.e., the initial calibration data and/or the historical calibration data logged over time) for a component may also be stored. Such calibration data may be stored on board in the ICE or such calibration data may be stored in an external database. The stored initial calibration data (which may be obtained during factory testing) may be queried (e.g., FIG. 3: 302) and employed to facilitate calibration of the component upon installation (e.g., FIG. 3: 304). The stored historical calibration data may be employed to determine if a component is likely to fail in the near future, for example. In an embodiment, if the historical calibration data shows significant changes recently, such a pattern may indicate that the part is likely to fail in the near future. As another example, the comparison between the current calibration value and the initial calibration value for a component may provide information regarding the state of the component. As yet another example, a pattern of changes in the calibration data of one component may indicate a problem with another part or portion of the system. By utilizing the stored calibration data, proactive component and/or system maintenance may be performed before the failure actually occurs.

Generally speaking, when the queried data from a smart component reveals that the component should not be used, at least two actions are available in the alternative. Firstly, the system may be disabled such that operation with the unsuitable component is not allowed. Second, the system may alternatively be allowed to operate (after a warning is provided, in an embodiment) but data is logged in order to provide proof that the owner assumed the risk of damage since he continued to use the system after being warned. Such proof helps the legitimate system manufacturer to avoid, for example, having to undertake warranty repair work on systems that are damaged from using unsuitable components.

Figure 4:
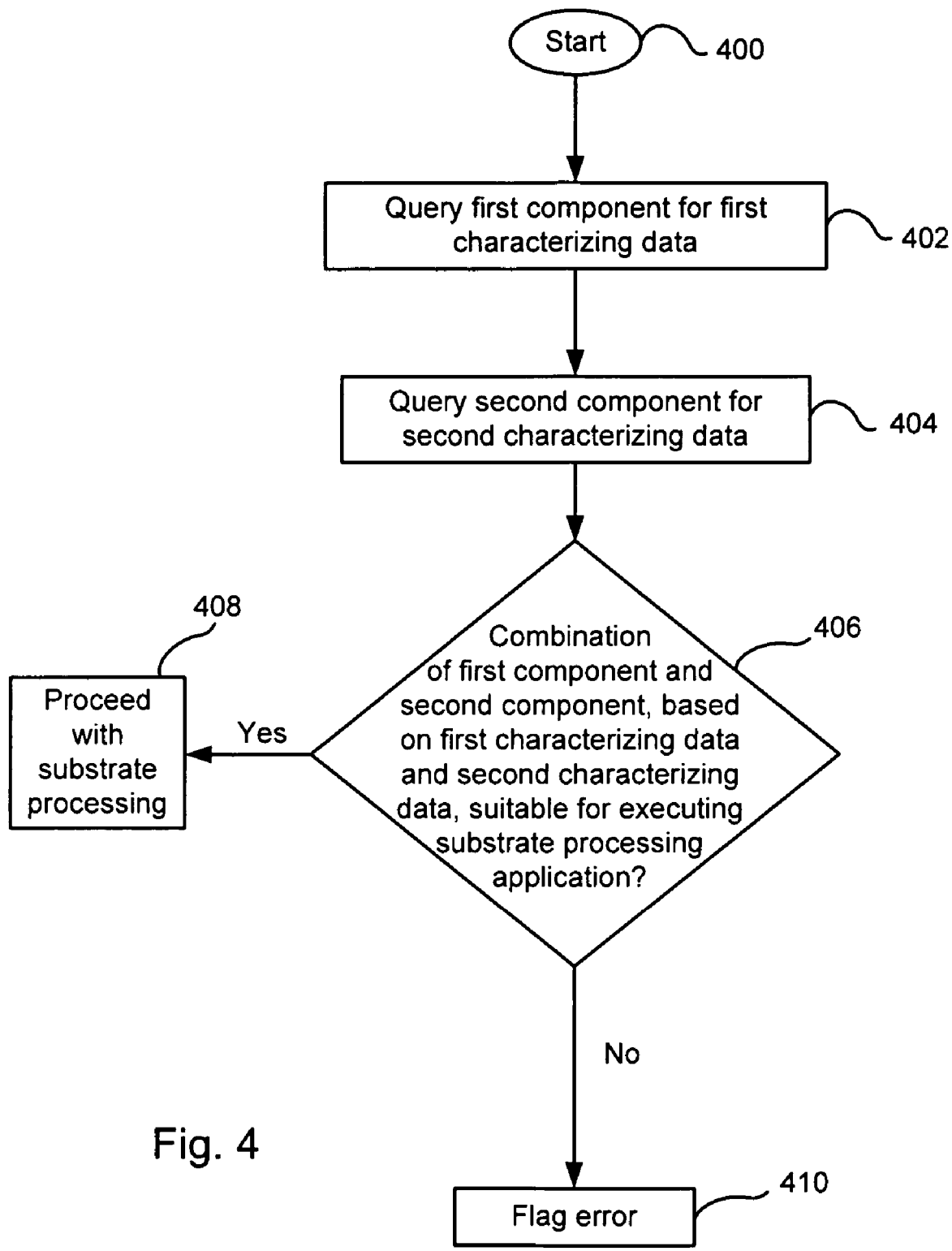
FIG. 4 illustrates, in accordance with another embodiment of the present invention, a method for managing components utilizing data from smart components.

The unique identifying data may also be employed during installation, configuration, or power-up to determine whether a component or all components of the substrate processing system are appropriate for use in the proposed application. Note that individual components may, in isolation, be certified and/or deemed suitable for use in a given application while a set of otherwise certified components installed together may conflict with one another and/or create conditions that degrade performance when employed together for another application. By automatically querying unique identification data from individual smart components (e.g., FIG. 4: 402–404) and employing such queried data in combination with an expert database hosted with the substrate processing system or via a network, such proactive approach may be undertaken to ensure that the substrate processing system is properly or optimally configured for executing the proposed application (e.g., FIG. 4: 406) before a single substrate is processed (e.g., FIG. 4: 408).

If one or more components are found to be unsuitable for a particular application, a recommendation may be provided to the system owner or operator to suggest a change to the components and/or the process recipe, or the substrate processing system may cause the smart components, if they have configuration capabilities, to be configured such that the application can be more optimally performed. Examples include causing a match network to have a different impedance value, for example. In this manner, the number of substrates wasted due to incorrectly configured substrate processing systems is substantially reduced.

The ability to automatically query smart component data from smart components may also be used to proactively maintain substrate processing systems, for example. If an engineer working for the substrate system manufacturer believes that a particular batch of smart components is defective, he may be able to employ a computer network to query the deployed systems (which may be spread throughout a manufacturing site or associated with different owners across continents) to ascertain whether they contain such a component. If the smart components respond, the engineer may be able to proactively request that the components be changed before system damage can occur.

The ICE may also include historical data regarding usage conditions, other components that it is installed along with in a system, and/or data regarding the applications. The historical data may be stored with the smart component itself or may be stored in an external data store that can be accessed using the ICE's unique identification data as a search key. The data may be collected by the host computer and/or the substrate processing system and downloaded into a smart component's ICE. The data may also be collected by the probes provided with the smart component and/or with the ICE. Data collection may be performed at all times (at predefined or configurable intervals), or the data collection capability may be user-configurable and may commence only when requested. The collected historical data may be uploaded as the data is collected, or the smart component may wait until an appropriate time (e.g., after the plasma cycle is complete or upon request) to upload the data.

This historical data may be employed to determine whether a smart component is or remains suitable for use in a particular system, in combination with other components in a given system, and/or with a particular application. The historical data may include not only the component identification data but also its calibration data, its usage records (e.g., number of hours in the field), and/or application data (e.g., since some applications may cause a higher degree of wear relative to other applications). The historical data is particularly useful for maintenance in that such data may allow the owner and/or operator to be proactive in component replacement and/or cleaning and/or any other maintenance task. In an embodiment, a replacement component can be automatically ordered by appropriate software-driven business logic if the historical data suggests that the component needs to be replaced in the near future. The fact that the historical data is automatically collected and may be employed to automatically trigger maintenance actions not only renders proactive maintenance more feasible but may also substantially reduce the maintenance record keeping burden, as well as reduce the chance for tracking errors.

In an embodiment, the historical data may be employed to project whether the smart component is suitable for a proposed production run. Suppose a smart component is near the end of its useful life. Its historical data may allow an engineer to determine whether there is sufficient useful life remaining to undertake the proposed production run, or whether the component should be replaced before the production run begins. Note that since the smart component has its own historical data regarding usage conditions, usage patterns, past applications, etc., the self-assessment of remaining useful life may be made with a higher degree of accuracy. In this manner, the useful life of a component is maximized. Alternatively, the historical data may allow the system to calibrate and/or modify other components and/or other process parameters to compensate, creating a more suitable environment for achieving favorable process results for a given component condition.

The historical data from one or more components in a system may also allow an engineer to more precisely ascertain the operating condition at a point in time in the past. Such forensic reconstruction of the past may be of immense help in pin-pointing the cause of failure either to the smart component which records the data or to any other component in the system. If an owner uses a uncertified component (e.g., an unsuitable or unapproved component) and such use causes a change in the operating conditions that contribute to the failure, the historical data queried from the smart components may allow the owner to pinpoint the cause of the failure, and/or furnish the innocent system manufacturer with exculpatory forensic evidence to allow the manufacturer to avoid having to perform unpaid warranty work on a system that breaks due to the unauthorized use of an improper component.

The following describes an exemplar scenario wherein smart components and inventive componentry management techniques substantially improve the installation, operation, and maintenance of a substrate processing system. When initially installed, the system may query its smart components and compare the data obtained regarding both the identity of the smart components and the component calibration parameters to determine whether the components are authorized and/or are suitable for use individually or together in the present system (e.g., whether the components will conflict with one another).

Once the system is ascertained to be properly installed (possibly by comparing the queried data from the smart components with data from a reference database), the queried data from the smart components may be automatically obtained and stored (at the individual smart components and/or with a centralized database) for historical record keeping so that subsequent data sets queried from the smart components of the system may be compared with this historical dataset for maintenance and/or diagnostic purposes.

At power up, the system may self-identify and/or may query the parts for the unique identifying data and any needed calibration and/or historical and/or collected environmental data in order to perform a self-diagnostic, and also to set any necessary parametric variables relating to desired calibration and compensation settings. This data may allow the system to determine whether a part is still within specification to perform for example the proposed etches and/or depositions.

If the application data (e.g., recipe) is available, the ICE data from the smart components of the system may be employed to ascertain whether the system, as a collective whole or as a collection of parts working together, is optimally configured to performed the proposed application. Note that the self-diagnostic test and this test for application suitability may be perform simultaneously. The system may also perform self-test on various movable or active parts, such as the mass flow controllers, the RF supply systems, etc.

Note that if a component is found to be unsuitable for use in the system and/or to perform the proposed application, the system may be disabled to prevent it from running and damaging itself. If the risk of damage is slight, the owner may be allowed to run the system with the component deemed to be unsuitable but with warnings clearly given and data logged (preferably in a form that is resistant to tampering) in order to prevent an unscrupulous user from later obtaining free warranty service and/or any other concessions from the legitimate system vendor when the substrate processing system eventually breaks down due to the use of an inappropriate component.

If an abnormal condition is encountered by one of the smart components during installation or during operation, the collected environmental data may cause an alarm to sound. The data is logged and optionally transmitted to the system manufacturer for quality control purposes. As mentioned, this data is preferably kept in a secure manner so that the data is resistant to tampering or unauthorized access.

As can be appreciated from the foregoing, the invention substantially improves componentry and system management with respect to the installation, operation, and maintenance of a substrate processing system. By endowing the parts of the substrate processing system with unique identification data and preferably with uniquely identification data that can be automatically read by a suitable transducer, the queried data may then be employed by inventive componentry management techniques in order to improve installation accuracy and to improve the likelihood that parts in the system are optimized to run the proposed application.

The unique identifying data, in combination with disclosed smart component-based management techniques, may substantially eliminate the chance that the use of counterfeit and/or inferior substitutes go undetected in a substrate processing system. The historical data stored on the parts contributes to a reduction in fraudulent warranty claims and helps engineers recreate the operating conditions of any point in time in the past to more accurately tune the substrate processing system and/or pinpoint the source of any failure. The correlation between data stored on the parts with external data stores greatly expands the usefulness of the ICE as a tool for improving substrate processing system installation, operation, and maintenance.

Thus, while this invention has been described in terms of several preferred embodiments, there are alterations, permutations, and equivalents which fall within the scope of this invention. For example, although the specific example is discussed in the context of a plasma processing system in general and a plasma etch system in particular, the invention may also apply to other substrate processing systems such as chemical vapor deposition (CVD) systems, plasma-enhanced chemical vapor deposition (PECVD) systems, physical vapor deposition (PVD) systems, rapid thermal processing (RTP) systems, lithography systems, etc. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a substrate processing system having a set of components, at least a plurality of components of said set of components being designated to be smart components, each component of said plurality of components having an intelligent component enhancement (ICE), a method of component managment, comprising:

querying, via a transducer, a first component of said plurality of components to obtain first calibration data, said first calibration data being obtained using one of a first technique and a second technique, said first technique involving obtaining said first calibration data from an ICE associated with said first component, said second technique involving obtaining unique identifying data from said ICE and employing said unique identifying data to obtain said first calibration data from a data store external to said first component;

employing said first calibration data in one of installing said substrate processing system and maintaining said substrate processing system.

2. The method of claim 1 wherein said first calibration data is employed for said installing said substrate processing system, said first calibration data represents calibration data that is specified for said first component upon initial installation of said substrate processing system.

3. The method of claim 1 wherein said first calibration data is employed for said maintaining said plasma processing system, said first calibration data representing a set of historical calibration data values for said first component.

4. The method of claim 3 wherein said maintaining includes ascertaining when said first component is to be replaced.

5. The method of claim 3 wherein said maintaining includes ascertaining a state of said first component.

6. The method of claim 3 wherein said maintaining includes ascertaining a problem condition with one of said first component and another component in said substrate processing system.

7. The method of claim 3 including electronically flagging said first component for corrective action if said first calibration data reveals that said first component requires maintenance.

8. The method of claim 7 wherein said corrective action includes electronically disabling said substrate processing system to prevent said substrate processing system from executing a substrate processing application.

9. The method of claim 7 wherein said corrective action includes providing a notification pertaining to a maintenance need of said first component to one of an operator of said substrate processing system and a manufacturer of said substrate processing system.

10. The method of claim 9 wherein said notification is sent via the Internet.

11. The method of claim 7 wherein said corrective action includes providing a notification pertaining to a maintenance need of said first component to one of an operator of said substrate processing system and permitting said operator to execute a substrate processing application after said operator consents to assume a risk associated with executing said substrate processing application in view of said notification.

12. The method of claim 11 further comprising logging data evidencing said operator consenting to assume said risk prior to permitting said operator to execute said substrate processing application.

13. The method of claim 1 wherein said first calibration data is employed to set parametric variables to optimize the process performance of said plasma processing system.

14. The method of claim 1 wherein said substrate processing system represents a plasma processing system.

15. The method of claim 1 wherein said substrate processing system represents a chemical-mechanical polish (CMP) system.

16. The method of claim 1 wherein said substrate processing system represents one of a chemical vapor deposition (CVD) system, a plasma-enhanced chemical vapor deposition (PECVD) system, a physical vapor deposition (PVD) system, a rapid thermal processing system (RTP), and a Lithography system.

17. The method of claim 1 wherein said querying is performed upon powering up of said substrate processing system prior to processing a substrate.

* * * * *